US 9,379,195 B2

(12) United States Patent
Khalil et al.

(10) Patent No.: US 9,379,195 B2
(45) Date of Patent: Jun. 28, 2016

(54) HEMT GAN DEVICE WITH A NON-UNIFORM LATERAL TWO DIMENSIONAL ELECTRON GAS PROFILE AND METHOD OF MANUFACTURING THE SAME

(75) Inventors: Sameh G. Khalil, Calabasas, CA (US); Karim S. Boutros, Moorpark, CA (US); Keisuke Shinohara, Thousand Oaks, CA (US)

(73) Assignee: HRL Laboratories, LLC, Malibu, CA (US)

(*) Notice: Subject to any disclaimer, the term of this patent is extended or adjusted under 35 U.S.C. 154(b) by 273 days.

(21) Appl. No.: 13/478,609

(22) Filed: May 23, 2012

(65) Prior Publication Data

US 2013/0313612 A1 Nov. 28, 2013

(51) Int. Cl.
| H01L 21/336 | (2006.01) |
| H01L 29/778 | (2006.01) |
| H01L 29/423 | (2006.01) |
| H01L 29/66 | (2006.01) |
| H01L 29/06 | (2006.01) |
| H01L 29/20 | (2006.01) |

(52) U.S. Cl.
CPC ............ *H01L 29/4236* (2013.01); *H01L 29/06* (2013.01); *H01L 29/66462* (2013.01); *H01L 29/7787* (2013.01); *H01L 29/2003* (2013.01)

(58) Field of Classification Search
CPC . H01L 29/778; H01L 21/336; H01L 29/4236; H01L 29/06; H01L 29/2003; H01L 29/7787; H01L 29/66462
USPC .................... 257/194, E29.252, E21.403, 195
See application file for complete search history.

(56) References Cited

U.S. PATENT DOCUMENTS

| 4,635,083 A | 1/1987 | Cooper, Jr. |
| 4,663,643 A | 5/1987 | Mimura |
| 4,800,172 A | 1/1989 | Okano |
| 5,254,863 A | 10/1993 | Battersby |
| 5,309,007 A | 5/1994 | Kelner |
| 7,038,253 B2 | 5/2006 | Yoshida et al. |
| 7,083,253 B2 | 8/2006 | Kimura |
| 7,859,014 B2 | 12/2010 | Nakayama |
| 8,076,685 B2 | 12/2011 | Tamura |

(Continued)

FOREIGN PATENT DOCUMENTS

| DE | 10 2010 016993 | 11/2011 |
| KR | 10-2011-0026798 A | 3/2011 |
| KR | 10-2011-0136719 A | 12/2011 |

OTHER PUBLICATIONS

H. Xing, "High Breakdown Voltage AlGaN/GaN HEMTs achieved by Multiple Field Plates", IEEE Electron Device Letters, vol. 25, No. 4, Apr. 2004.

(Continued)

*Primary Examiner* — Asok K Sarkar
*Assistant Examiner* — Dmitriy Yemelyanov
(74) *Attorney, Agent, or Firm* — Ladas & Parry

(57) ABSTRACT

A high electron mobility field effect transistor (HEMT) having a substrate, a channel layer on the substrate and a barrier layer on the channel layer includes a stress inducing layer on the barrier layer, the stress inducing layer varying the piezoelectric effect in the barrier layer in a drift region between a gate and a drain. A two dimensional electron gas (2DEG) has a non-uniform lateral distribution in the drift region between the gate and the drain.

7 Claims, 5 Drawing Sheets

(56) References Cited

U.S. PATENT DOCUMENTS

| | | | |
|---|---|---|---|
| 8,124,505 | B1 | 2/2012 | Burnham |
| 8,159,004 | B2 | 4/2012 | Sato |
| 8,680,536 | B2 | 3/2014 | Khalil et al. |
| 2005/0023555 | A1 | 2/2005 | Yoshida |
| 2006/0220065 | A1* | 10/2006 | Kawasaki et al. ............ 257/200 |
| 2007/0158692 | A1* | 7/2007 | Nakayama et al. ........... 257/213 |
| 2008/0157121 | A1 | 7/2008 | Ohki |
| 2009/0008677 | A1 | 1/2009 | Kikkawa |
| 2009/0072272 | A1 | 3/2009 | Suh |
| 2009/0315075 | A1 | 12/2009 | Sato |
| 2010/0025730 | A1 | 2/2010 | Heikman |
| 2010/0055882 | A1 | 3/2010 | Imhoff |
| 2010/0117146 | A1 | 5/2010 | Ikeda et al. |
| 2010/0140660 | A1* | 6/2010 | Wu et al. ....................... 257/183 |
| 2010/0140663 | A1 | 6/2010 | Hopper |
| 2010/0219452 | A1* | 9/2010 | Brierley ........................ 257/194 |
| 2011/0018040 | A1 | 1/2011 | Smith et al. |
| 2011/0031532 | A1 | 2/2011 | Kikkawa |
| 2011/0049526 | A1 | 3/2011 | Chu |
| 2011/0057257 | A1 | 3/2011 | Park |
| 2011/0092057 | A1 | 4/2011 | Suvorov |
| 2011/0127541 | A1 | 6/2011 | Wu |
| 2011/0254012 | A1 | 10/2011 | Vashchenko |
| 2011/0263102 | A1 | 10/2011 | Heikman et al. |
| 2011/0303952 | A1 | 12/2011 | Hwang |
| 2012/0091508 | A1 | 4/2012 | Aoki |
| 2012/0098599 | A1* | 4/2012 | Chang et al. .................. 330/277 |
| 2012/0211760 | A1 | 8/2012 | Yamada |
| 2012/0261720 | A1 | 10/2012 | Puglisi et al. |
| 2013/0049071 | A1 | 2/2013 | Jung et al. |
| 2013/0313611 | A1 | 11/2013 | Khalil |
| 2014/0051221 | A1 | 2/2014 | Khalil |

OTHER PUBLICATIONS

C.M. Waits, et al., "Gray-Scale Lithography for MEMS Applications", University of Maryland, Department of Electrical Computer Engineering, Institute for Advanced Computer Studies, College Park, Maryland, U.S. 2006.

W. Henke, et al. "Simulation and experimental study of gray-tone lithography for the fabrication of arbitrarily shaped surfaces" Proc. IEEE Micro Electro Mechanical Syst. MEMS 1994, Oiso, Japan, pp. 205-210.

C.M. Waits, et al. "MEMS-based Gray-Scale Lithography" International Semiconductor Device Research Symposium (ISDRS), Dec. 5-7, 2001, Washington D.C.

PCT Search Report and Written Opinion mailed on Aug. 26, 2013 from PCT/US2013/040447 (9 pages).

From U.S. Appl. No. 13/478,402 (unpublished), Application and Office Actions mailed on May 23, 2013 and Aug. 15, 2013.

From U.S. Appl. No. 13/478,018 (unpublished), Application and Office Actions mailed on Mar. 29, 2013 and Jul. 19, 2013.

Song et al, "Normally off AlGaN/GaN Low-Density Drain HEMT (LDD-HEMT) With Enhanced Breakdown Voltage and Reduced Current Collapse", IEEE Electron Device Letters, vol. 28, No. 3, Mar. 2007.

PCT International Search Report and Written Opinion mailed on Sep. 30, 2013 for corresponding PCT Application No. PCT/US2013/040431 (9 pages).

PCT International Search Report and Written Opinion mailed on Sep. 27, 2013 for related PCT Application No. PCT/US2013/040441 (10 pages).

From U.S. Appl. No. 13/478,402 (unpublished), Application and Office Actions, including but not limited to the Office Actions mailed on May 23, 2013 and Aug. 15, 2013.

From U.S. Appl. No. 13/479,018 (unpublished), Application and Office Actions, including but not limited to the Office Actions mailed on Mar. 29, 2013 and Jul. 19, 2013.

U.S. Appl. No. 13/478,402, filed May 23, 2012, Khalil.

U.S. Appl. No. 13/479,018, filed May 23, 2012, Khalil.

Smorchkova, I. P. et al., "Polarization-induced charge and electron mobility in AlGaN/GaN heterostructures grown by plasma-assisted molecular epitaxy," Journal of Applied Physics, vol. 86, Issue 8, pp. 4520-4526, Oct. 1999.

Notice of Allowance dated Sep. 11, 2014 for U.S. Appl. No. 14/063,207 (now published as US 2014-0051221).

Non-Final Office Action dated Aug. 25, 2014 for U.S. Appl. No. 14/163,898 (unpublished/non publication request filed Jan. 24, 2014).

U.S. Appl. No. 14/163,898, filed Jan. 24, 2014, Sameh Khalil.

Non-Final Office Action dated May 5, 2014 for U.S. Appl. No. 13/478,402 (now published as US 2013/0313611).

Notice of Allowance dated Jul. 9, 2014 for U.S. Appl. No. 13/478,402 (now published as US 2013/0313611).

Notice of Allowance dated Oct. 25, 2013 for U.S. Appl. No. 13/479,018 (now published as U.S. Pat. No. 8,680,536).

U.S. Appl. No. 14/163,898 and Office Actions.

Chapter II PCT International Preliminary Report on Patentability mailed on May 6, 2014 from related PCT Application No. PCT/US2013/040431.

Chapter II PCT International Preliminary Report on Patentability mailed on May 23, 2014 from related PCT Application No. PCT/US2013/040441.

International Preliminary Report on Patentability (Chapter I) for PCT/US2013/040441 mailed on Nov. 25, 2014.

International Preliminary Report on Patentability (Chapter I) for PCT/US2013/040431 mailed on Nov. 25, 2014.

From U.S. Appl. No. 13/478,402 (now U.S. Pat. No. 9,000,484), Notice of Allowance dated Dec. 1, 2014.

From U.S. Appl. No. 14/063,207 (now U.S. Pat. No. 8,933,487), Notice of Allowance dated Oct. 20, 2014.

From U.S. Appl. No. 14/163,898 (now U.S. Pat. No. 8,999,780), Notice of Allowance dated Dec. 3, 2014.

EPO Extended Supplementary Search Report dated Oct. 21, 2015 from European Patent Application No. 13793952.6.

* cited by examiner

```
┌─────────────────────────────────────────────────────────┐
│ FORMING A PASSIVATION LAYER OVER THE BARRIER      110   │
│   LAYER                                                  │
└─────────────────────────────────────────────────────────┘
                            │
┌─────────────────────────────────────────────────────────┐
│ FORMING A GATE COMPRISING THE STEPS OF FORMING          │
│   A TRENCH EXTENDING THROUGH THE PASSIVATION       112  │
│   LAYER AND INTO THE BARRIER LAYER, DEPOSITING A        │
│   GATE DIELECTRIC LAYER IN THE TRENCH, AND FORMING      │
│   GATE METAL ON THE GATE DIELECTRIC                     │
└─────────────────────────────────────────────────────────┘
                            │
┌─────────────────────────────────────────────────────────┐
│ WHEREIN FORMING A TRENCH EXTENDING THROUGH THE          │
│   PASSIVATION LAYER AND INTO THE BARRIER LAYER     114  │
│   FURTHER COMPRISES FORMING THE TRENCH TO               │
│   EXTEND INTO THE CHANNEL LAYER                         │
└─────────────────────────────────────────────────────────┘
                            │
┌─────────────────────────────────────────────────────────┐
│ FORMING AN OPENING IN THE STRESS INDUCING LAYER   116   │
│   UNDER THE DRAIN FOR PROVIDING CONTACT OF THE          │
│   DRAIN TO THE BARRIER LAYER                            │
│                                                          │
└─────────────────────────────────────────────────────────┘
                            │
┌─────────────────────────────────────────────────────────┐
│ FORMING AN OPENING IN THE STRESS INDUCING LAYER         │
│   UNDER A SOURCE FOR PROVIDING CONTACT OF THE      118  │
│   SOURCE TO THE BARRIER LAYER                           │
└─────────────────────────────────────────────────────────┘
```

FIG. 3B

HEMT GAN DEVICE WITH A NON-UNIFORM LATERAL TWO DIMENSIONAL ELECTRON GAS PROFILE AND METHOD OF MANUFACTURING THE SAME

STATEMENT REGARDING FEDERAL FUNDING

This invention was made under U.S. Government contract NONE STATED. The U.S. Government has certain rights in this invention.

This application is related to U.S. patent application Ser. No. 13/479,018 filed on the same date as this application and entitled "Controlling Lateral Two-Dimensional Electron Hole Gas HEMT in Type III Nitride Devices using Ion Implantation Through Gray Scale Mask" and to U.S. patent application Ser. No. 13/478,402 filed on the same date as this application and entitled "Non-Uniform Two-Dimensional Electron Gas Profile in III-Nitride HEMT Devices".

TECHNICAL FIELD

This disclosure relates to type III-nitride high electron mobility transistor (HEMT) devices and in particular to two dimensional electron gas (2DEG) in the drift region.

BACKGROUND

A high electron mobility transistor (HEMT) is a field effect transistor incorporating a junction between two materials with different band gaps (i.e., a heterojunction). Gallium nitride (GaN) HEMTs have attracted attention due to their high-power performance. In type III-nitride HEMT devices used in power applications there is a conflicting design tradeoff between the on-state resistance and breakdown voltage (BV). Since the relation between the BV and on resistance is at least quadratic, improvement in the BV for a given drift region length results in a significant improvement in the FOM of the device, defined as $BV^2/Ron$.

In the prior art type III-nitride HEMT devices have a uniform 2DEG density which results in a peak electric field under or near the gate region. The electric field distribution tends to be closer to a triangular shape than to the desired trapezoidal shape which reduces the breakdown voltage per unit drift region length of the device. The use of field plate and multistep field plates are some of the techniques that are used to improve the electric field distribution. However, field plates typically result in multiple peaks and suffer from less than an ideal flat field distribution, and may exhibit a saw tooth profile. Field plates also add to the gate to drain capacitance. In addition, process complexity and cost typically increase with the number of field plate steps.

U.S. Pat. No. 7,038,253 to Furukawa describes a GaN based device on silicon (Si) technology which uses a uniform 2DEG profile in the drift region. Because of the absence of any field shaping technique in the Furukawa device, the breakdown voltage and dynamic on resistance from drain to source is limited by a localized increase in the electric field under the gate region thus requiring over design of the device which degrades the figure of merit (FOM) that such a device can achieve.

In "High Breakdown Voltage AlGaN/GaN HEMTs Achieved by Multiple Field Plates" by H. Xing et. Al, a field shaping technique that uses multiple field plates is described to improve the electric field distribution. However, multiple field plates do not achieve a uniform electric field, may have a saw tooth type distribution, and introduce gate to drain capacitance. Implementing such a device structure also increases device complexity and cost.

What is needed is a significant improvement in the FOM in HEMT devices, and in particular an improvement in the breakdown voltage for a given drift region length, so that the FOM of the device, defined as $BV^2/Ron$, improves. The embodiments of the present disclosure answer these and other needs.

SUMMARY

In a first embodiment disclosed herein, a high electron mobility field effect transistor (HEMT) having a substrate, a channel layer on the substrate and a barrier layer on the channel layer comprises a stress inducing layer on the barrier layer, the stress inducing layer varying the piezo-electric effect in the barrier layer in a drift region between a gate and a drain, wherein a two dimensional electron gas (2DEG) has a non-uniform lateral distribution in the drift region between the gate and the drain.

In yet another embodiment disclosed herein, a method of fabricating a high electron mobility field effect transistor (HEMT) comprises forming a channel layer on a substrate, forming a barrier layer on the channel layer, and forming a stress inducing layer on the barrier layer, the stress inducing layer varying the piezo-electric effect in the barrier layer in a drift region between a gate and a drain, wherein a two dimensional electron gas (2DEG) has a non-uniform lateral distribution in the drift region between the gate and the drain.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 3A and 3B are flow diagrams for methods of fabricating a HEMT device in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
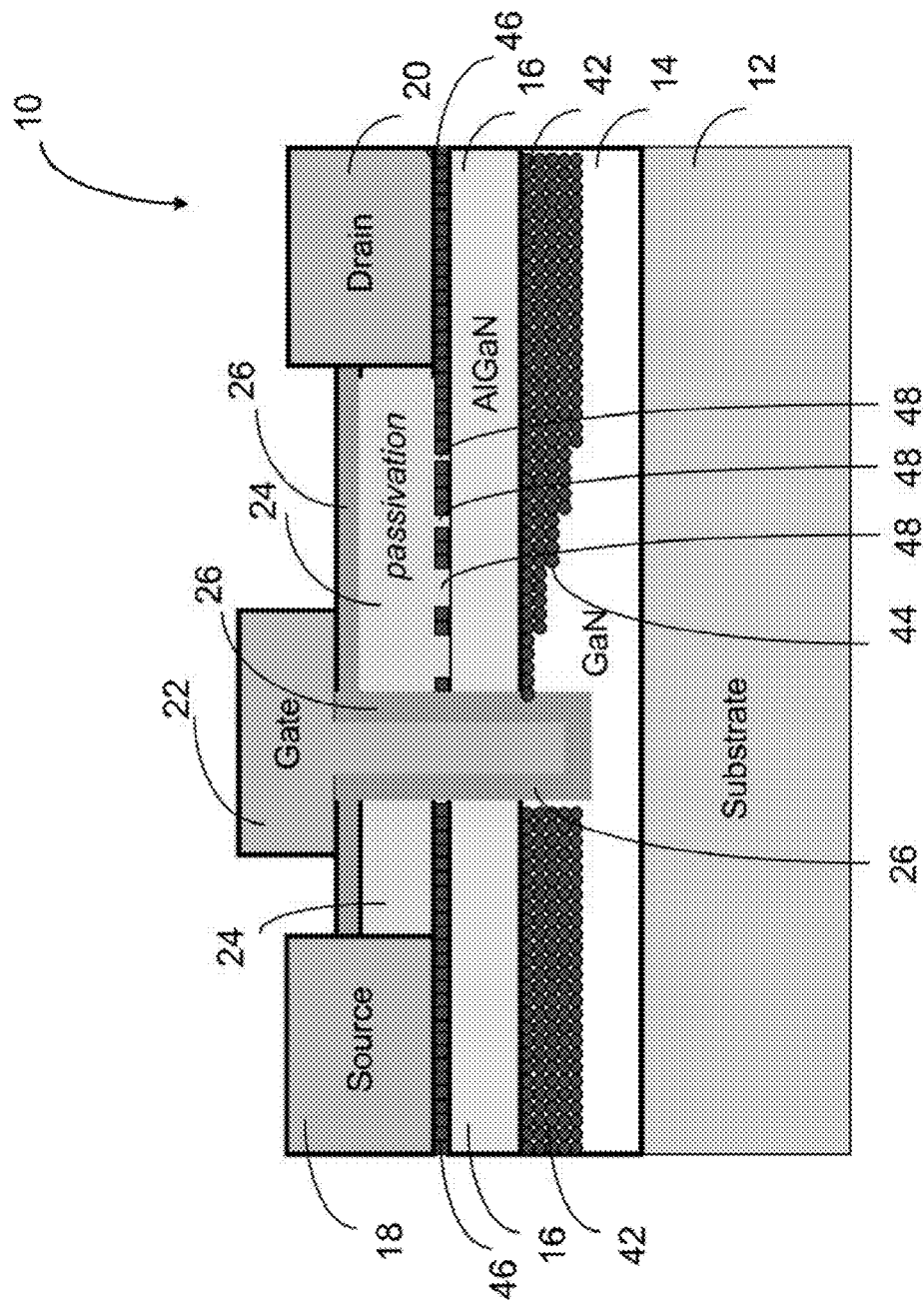
FIG. 1 shows a deposited layer on top of the carrier supplying layer with varying size openings to induce a stress and modulate the density of a two dimensional electron gas (2DEG) in a HEMT device in accordance with the present disclosure.

Referring now to FIG. 1, a field effect transistor (FET) device structure 10 is shown. The FET device structure 10 is composed of a stack of III-V layers, such as GaN layer 14 and AlGaN layer 16, grown on a substrate 12 that can be any of the suitable substrates that are commonly used to grow type III-Nitride materials. Suitable substrates include but are not limited to silicon (Si), Sapphire, silicon carbide (SiC), and bulk single crystal gallium nitride (GaN).

The stack of III-V layers may include a buffer layer of GaN or aluminum gallium nitride (AlGaN) grown on the substrate 12. Then a type III layer, such as GaN layer 14, for the channel and carrier travelling layer, is grown on the buffer layer. Then a type V layer, such as AlGaN layer 16, for the barrier layer and the carrier supplying layer, is grown on top of the GaN layer 14. An AlN spacer layer may be between the GaN layer 14 and the AlGaN layer 16 to improve device electrical performance.

As shown in FIG. 1, on top of the barrier layer layer 16 a stress inducing layer 46 is grown to induce a stress and modulate the charge in the 2DEG 42, as shown in FIG. 1. In one embodiment the stress inducing layer 46 is etched with openings 48 in specific areas, as shown in FIG. 1, using a mask. The stress inducing layer 46 modulates the stress in the stress inducing layer 46. The stress varies the piezoelectric effect in the barrier layer 16 and hence the 2DEG 42 in a drift region between the gate 22 and the drain 20.

Figure 4:
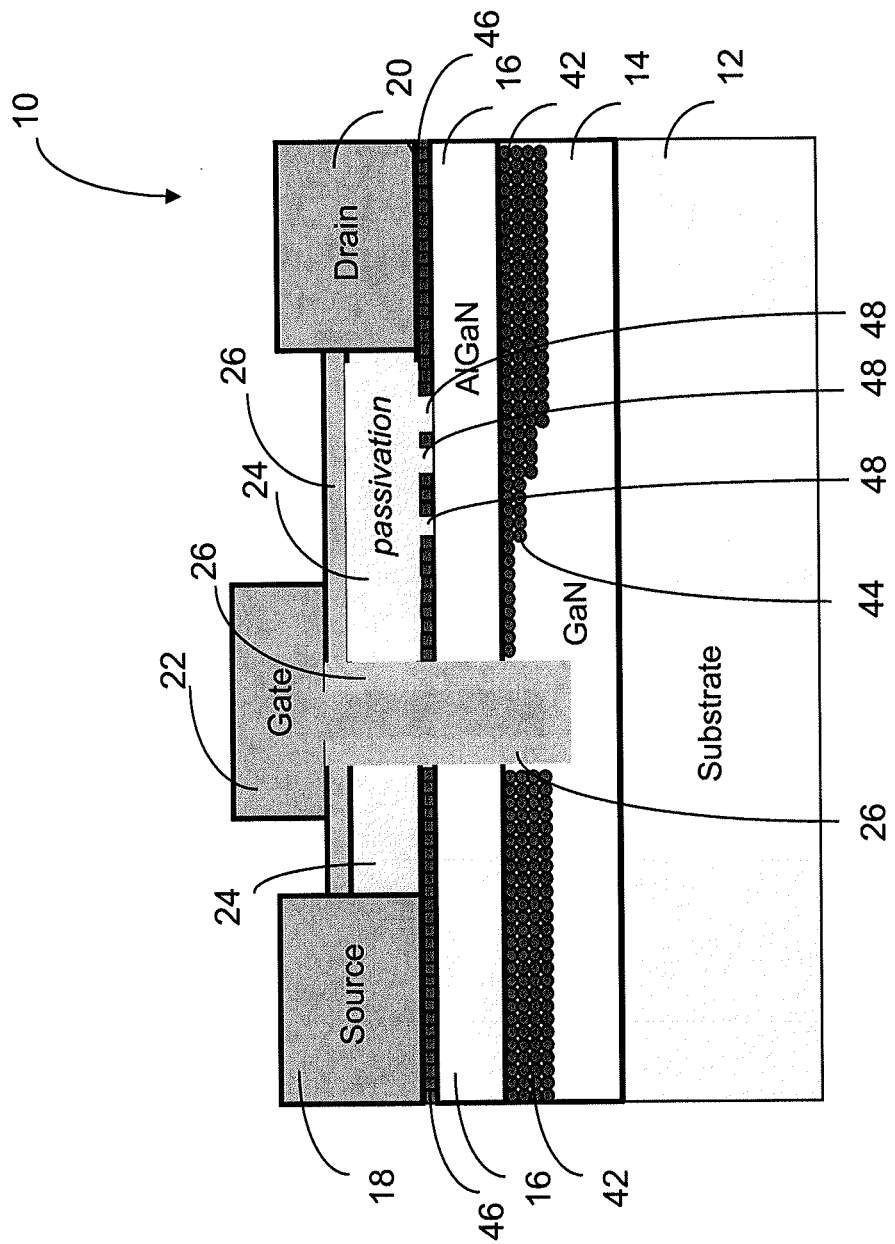
FIG. 4 shows a deposited layer on top of the carrier supplying layer with openings increasing in size from the gate to the drain in accordance with the present disclosure.

The lateral control of the stress in the stress inducing layer 46 over the drift region may be achieved by etching different size openings 48 in the stress inducing layer 46 that either increase or decrease in size from the gate 22 to the drain 20 depending on the polarity of the stress the deposited layer is exerting on the barrier or charge supplying layer, as shown in FIG. 4 and FIG. 1, respectively.

If it is desired to increase the piezoelectric effect in the drift region from gate 22 to drain 20, the size of the openings 48 are larger near the gate 22 and decrease in size towards the drain 20, as shown in FIG. 1.

If it is desired to reduce the piezoelectric effect in the drift region from the gate 22 to the drain 20, the size of the openings 48 are made smaller near the gate 22 and increase in size towards the drain 20.

Since the density of charge in the 2DEG region is determined locally by the magnitude of the piezoelectric effect, a non-uniform 2DEG 42 distribution may be achieved by varying the magnitude of piezoelectric effect over the drift region as a function of distance from the gate 22 towards the drain 20 along the drift region. In the embodiment shown in FIG. 1 the piezoelectric effect in the drift region increases from the gate 22 towards the drain 20, and the size of the openings 48 are larger near the gate 22 and decrease in size towards the drain 20. Such an embodiment results in the 2DEG 42 varying in density such that the 2DEG increases in density in the drift region from the gate 22 towards the drain 20.

As described above, if it is desired to reduce the piezoelectric effect in the drift region from gate 22 to drain 20, the size of the openings 48 may be made smaller near the gate 22 and increased in size towards the drain 20.

Figure 2:
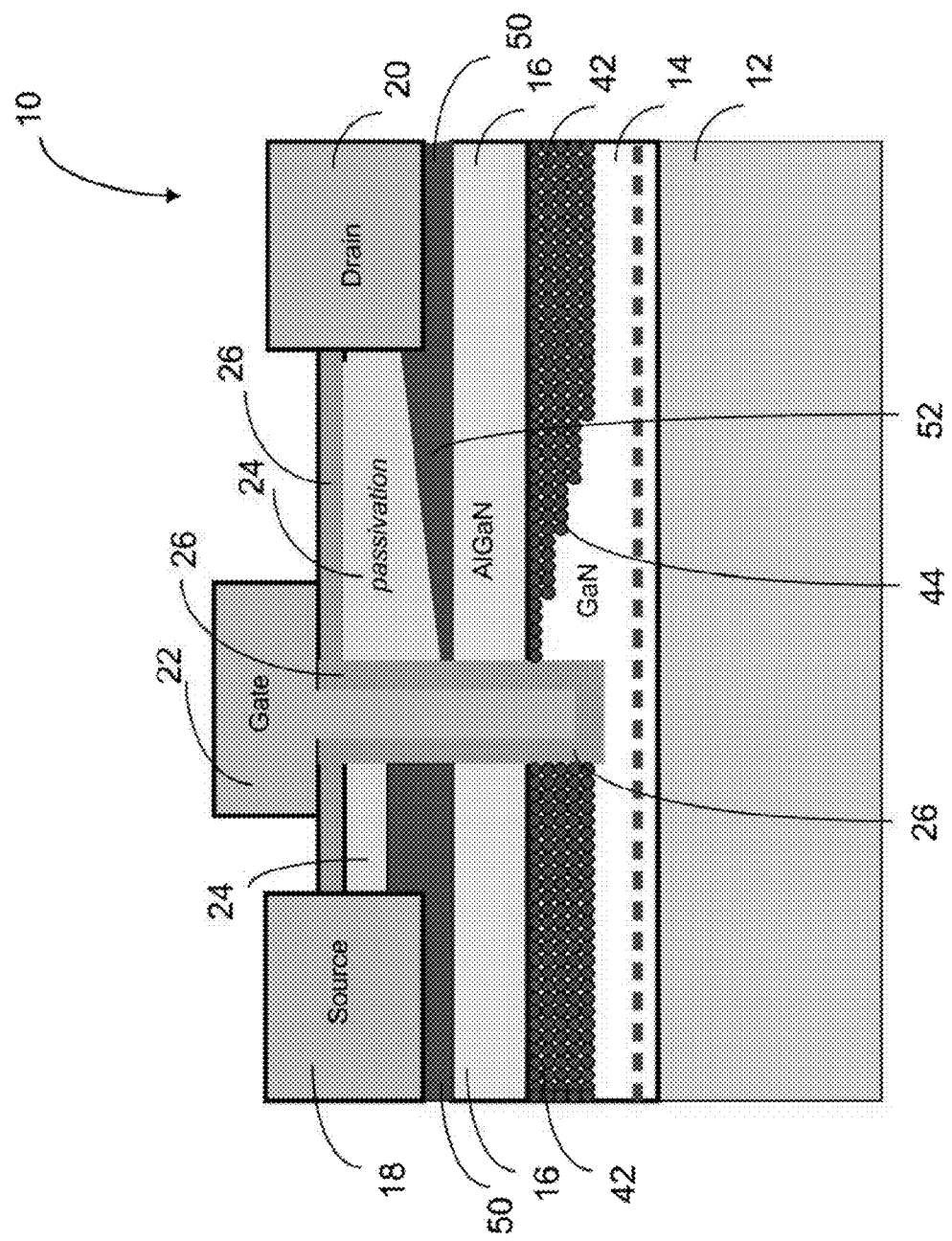
FIG. 2 shows a deposited layer on top of the carrier supplying layer with a varying height profile to induce a stress and modulate the density of a two dimensional electron gas (2DEG) in a HEMT device in accordance with the present disclosure.

In another embodiment, shown in FIG. 2, a stress inducing layer 50 is grown on top of the AlGaN layer 16. The non-uniform lateral 2DEG 44 is achieved in this embodiment by using Gray scale photolithography to form a stress inducing layer 50 having a lateral profile that has a height that varies.

Gray scale photolithography uses a gray scale mask to form a stress inducing layer 50 that has a lateral profile and has a height that increases or decreases in the drift region between the gate 22 and the drain 20, depending on the polarity of the stress to be induced.

In the embodiment shown in FIG. 2, the height of the stress inducing layer 50 increases in the drift region between the gate 22 and the drain 20. The stress inducing layer 50 varies the magnitude of piezoelectric effect over the drift region as a function of distance from the gate 22 towards the drain 20 along the drift region. In the embodiment shown in FIG. 2, the stress and the piezoelectric effect in the drift region increases from the gate 22 towards the drain 20. Such an embodiment results in the 2DEG 42 varying in density such that the 2DEG 44 increases in density in the drift region from the gate 22 towards the drain 20.

As described above, if it is desired to reduce the piezoelectric effect in the drift region from the gate 22 to the drain 20, the height of the stress reducing layer 50 decreases in the drift region in the direction from the gate 22 towards the drain 20.

The source contact 18 and the drain contact 20 are formed by metal evaporation or metal sputtering to contact the barrier layer 16 after opening a contact window in the stress inducing layer 46, in the embodiment of FIG. 1, or stress inducing layer 50, in the embodiment of FIG. 2.

A passivation layer 24 may be grown on top of the stress inducing layer 46 or the stress inducing layer 50.

A gate region is then formed by etching a trench through the passivation layer 24 and the stress inducing layer 46 or 50 in a gate area between the source 18 and drain 20 and into the AlGaN layer 16. In another embodiment the etched trench may extend through the AlGaN layer 16 and partially into the GaN layer 14 to an appropriate depth. A gate dielectric 26 is then deposited over the area between the source 18 and gate 22 and the gate 22 and the drain 20, and also deposited to line the etched trench that extends into the AlGaN layer 16. If the etched trench extends into the GaN layer 14, then the gate dielectric 26 also lines the etched trench that extends into the GaN layer 14.

After deposition of the gate dielectric 26, gate metal 22 is formed by evaporation or sputtering and fills the etched trench.

Various alternating passivation and metallization layers may be formed as a part of back-end processing to improve the parasitic resistance of the device and provide connection to device pads and/or a package.

Use of the stress inducing layer 46 or 50 to vary the piezoelectric effect in the barrier or charge supplying layer 16, and hence the 2DEG density in the drift region between the gate 22 and the drain 20, may provide a significant improvement of the figure of merit (FOM) in type III Nitride HEMT devices by achieving a flat electric field distribution in the drift region between the gate 22 and the drain 20. The 2DEG 42 is varied in the drift region to form a non-uniform lateral 2DEG distribution 44, as shown in FIGS. 1 and 2. A flat electric field distribution results from the non-uniform lateral 2DEG distribution 44 along the drift region which provides the improvement in the figure of merit (FOM), defined as $BV^2/Ron$.

Figure 3A:
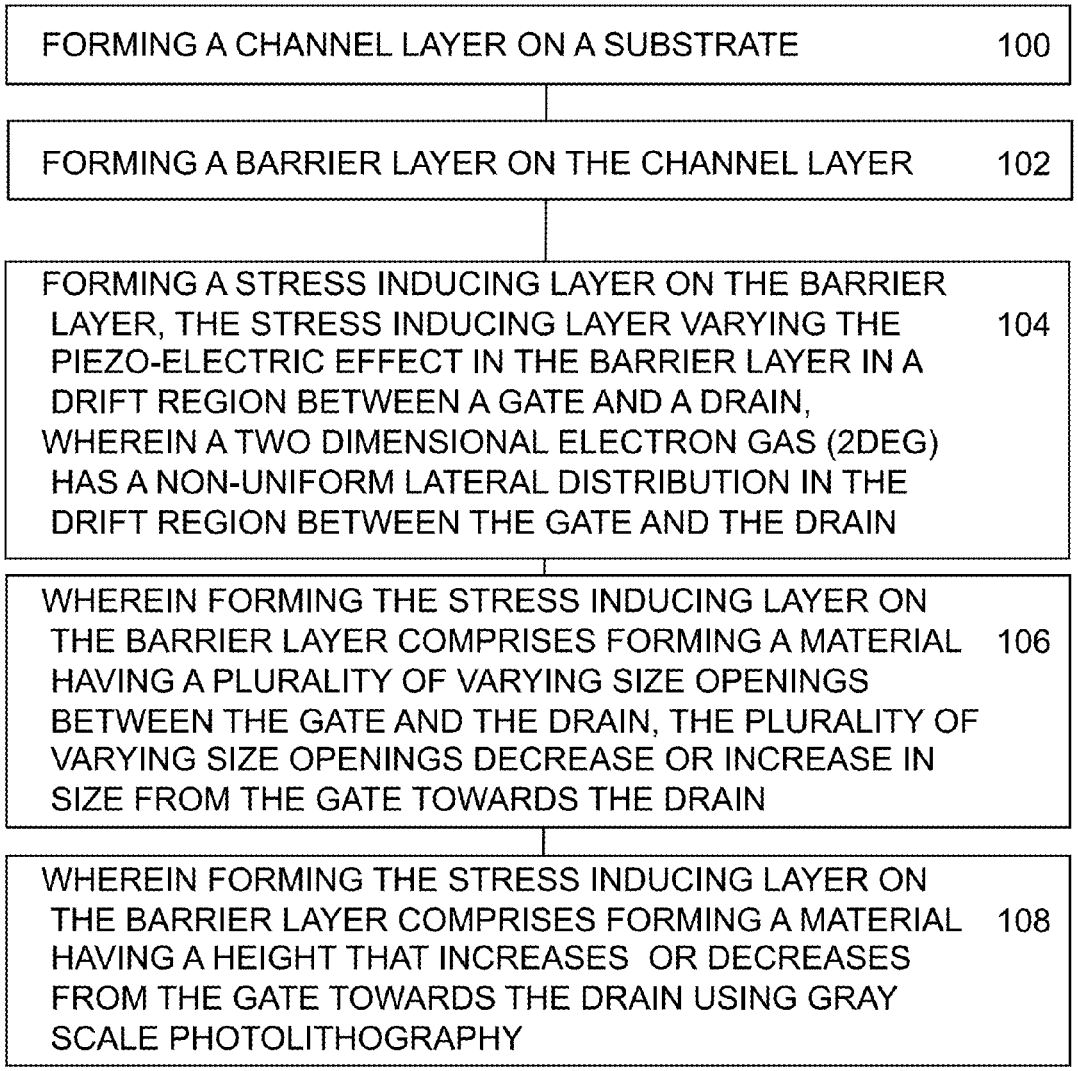

FIGS. 3A and 3B are flow diagrams for methods of fabricating a HEMT device in accordance with the present disclosure.

In step 100 a channel layer is formed on a substrate. Then in step 102 a barrier layer is formed on the channel layer. Next in step 104 a stress inducing layer is formed on the barrier layer, the stress inducing layer varying the piezo-electric effect in the barrier layer in a drift region between a gate and a drain, wherein a two dimensional electron gas (2deg) has a non-uniform lateral distribution in the drift region between the gate and the drain.

In step 106 forming the stress inducing layer on the barrier layer includes forming a material having a plurality of varying size openings between the gate and the drain, the plurality of varying size openings decrease or increase in size from the gate towards the drain.

In step 108 forming the stress inducing layer on the barrier layer includes forming a material having a height that increases or decreases from the gate towards the drain using gray scale photolithography.

In step 110 a passivation layer is formed over the barrier layer. In step 112 a gate is formed comprising the steps of forming a trench extending through the passivation layer and into the barrier layer, depositing a gate dielectric layer in the trench, and forming gate metal on the gate dielectric. In step 114 the forming a trench extending through the passivation layer and into the barrier layer further includes forming the trench to extend into the channel layer.

In step 116 an opening is formed in the stress inducing layer under the drain for providing contact of the drain to the barrier layer. And finally, in step 118 an opening is formed in the stress inducing layer under a source for providing contact of the source to the barrier layer

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A high electron mobility field effect transistor (HEMT) having a substrate, a channel layer on the substrate and a barrier layer on the channel layer, the HEMT comprising:
   a stress inducing layer on and in contact with the barrier layer, wherein the stress inducing layer varies a piezoelectric effect in the barrier layer in a drift region between a gate and a drain, and wherein the stress inducing layer extends from the gate to under the drain;
   wherein the piezo-electric effect in the barrier layer varies a two dimensional electron gas (2DEG) in the drift region between the gate and the drain;
   wherein the two dimensional electron gas (2DEG) has a non-uniform lateral distribution in the drift region between the gate and the drain;
   wherein the stress inducing layer comprises a material having a plurality of varying size openings that decrease in size or increase in size from the gate towards the drain;
   wherein the plurality of openings in the stress inducing layer are between the gate and the drain; and
   wherein the plurality of openings in the stress inducing layer extend through the stress inducing layer to the barrier layer.

2. The HEMT of claim 1:
   wherein the plurality of varying size openings decrease in size from the gate towards the drain; and
   wherein the 2DEG increases in density in the drift region from the gate towards the drain.

3. The HEMT of claim 1:
   wherein the plurality of varying size openings increase in size from the gate towards the drain.

4. The HEMT of claim 1 wherein:
   the substrate comprises silicon (Si), sapphire, silicon carbide (SiC), OR bulk single crystal gallium nitride (GaN);
   the channel layer comprises a GaN layer; and
   the barrier layer comprises a AlGaN layer.

5. The HEMT of claim 1 further comprising:
   a passivation layer over the stress inducing layer; and
   wherein the gate comprises:
      gate metal extending through the passivation layer and into the barrier layer; and
      a gate dielectric layer surrounding the gate metal extending through the passivation layer and into the barrier layer.

6. The HEMT of claim 1 further comprising:
   a passivation layer over the barrier layer; and
   wherein the gate comprises:
      gate metal extending through the passivation layer and the barrier layer and into the channel layer; and
      a gate dielectric layer surrounding the gate metal extending through the passivation layer and the barrier layer and into the channel layer.

7. The HEMT of claim 1 wherein the stress inducing layer extends from the gate to under a source.

* * * * *